United States Patent [19]

Heimsch et al.

[11] 3,993,489

[45] Nov. 23, 1976

[54] MULTI-COLOR LAMINATE OF PHOTOPOLYMER THAT IS IMAGE-WISE HYDROPEROXIDIZED

[75] Inventors: Robert A. Heimsch, St. Louis; Eric T. Reaville, Webster Groves, both of Mo.

[73] Assignee: Monsanto Company, St. Louis, Mo.

[22] Filed: Sept. 26, 1975

[21] Appl. No.: 617,123

Related U.S. Application Data

[60] Division of Ser. No. 415,845, Nov. 14, 1973, Pat. No. 3,925,076, which is a division of Ser. No. 115,727, Feb. 16, 1971, Pat. No. 3,790,389, which is a continuation-in-part of Ser. No. 644,121, June 7, 1967, abandoned.

[52] U.S. Cl. ......................................... 96/77; 96/67; 96/68; 96/80; 96/115 R; 96/87 R; 96/115 P
[51] Int. Cl.² ..................... G03C 1/40; G03C 1/68
[58] Field of Search ............... 96/67, 68, 69, 72, 73, 96/74, 77, 80, 115 R, 115 P, 87 R; 204/159.23; 260/314

[56] References Cited

UNITED STATES PATENTS

| | | | |
|---|---|---|---|
| 2,950,237 | 8/1960 | Sharp | 260/314 |
| 2,951,800 | 9/1960 | Sharp | 260/314 |
| 3,012,885 | 12/1961 | Abbott et al. | 96/35 |
| 3,029,145 | 4/1962 | Dumers et al. | 96/35 |
| 3,042,516 | 7/1962 | Wainer | 96/115 R |
| 3,097,096 | 7/1963 | Oster | 204/159.23 |
| 3,216,825 | 11/1965 | Caldwell | 96/87 |
| 3,244,519 | 4/1966 | Schwerin | 96/72 X |
| 3,390,996 | 7/1968 | MacLachlan | 96/90 |
| 3,585,030 | 6/1971 | Pelz et al. | 96/72 X |

*Primary Examiner*—Edward C. Kimlin

[57] ABSTRACT

This invention relates to light sensitive compositions comprising a photosensitizer and a substrate useful in preparing photographic images.

1 Claim, No Drawings

MULTI-COLOR LAMINATE OF PHOTOPOLYMER THAT IS IMAGE-WISE HYDROPEROXIDIZED

This application is a division of application Ser. No. 415,845, filed Nov. 14, 1973, now U.S. Pat. No. 3,925,076, which is a division of application Ser. No. 115,727, filed Feb. 16, 1971, now U.S. Pat. No. 3,790,389, which is a continuation-in-part of application Ser. No. 644,121, filed June 7, 1967, and now abandoned.

This invention relates to photosensitive surfaces useful in photography and photo-copy reproduction processes. More particularly, this invention provides new photosensitive compositions suitable for coating surfaces to impart thereto the ability to receive a photographic latent or visual image, and also provides new photosensitized surfaces useful directly for replica or image reproduction and copy work. The invention also includes processes for copying by developing the latent images which are produced on surfaces of photosensitive articles of this invention, using the compositions of this invention.

In the graphic arts industry represented by photography, photoengraving, photolithography, collotype, etc. silver halides and diazo compounds have been used as photosensitive materials to absorb energy from the light spectrum in processes for making photographic images and in reprography. Such photosensitive agents have usually required close control of chemicals used, time and amount of treatment to develop the images of objects replicated on the surface by exposure of the object to the photosensitive surface in the light spectrum. Such processes are both expensive and impractical, however, when it is desired to prepare numerous copies or replicas of an object or image on an inexpensive surface such as a cellulosic web for example cellulosic films, paper sheets and boards, and closely woven cellulosic textiles. In addition, the chemicals often used to develop and fix the silver halide or diazo photosensitized surfaces often need close temperature and concentration control, or the use of water solutions to effect acceptable reproduction on the photosensitized surface.

It is therefore desirable to find photosensitive materials and substrates which can be placed on smooth surfaces to effect simple, inexpensive photoreproduction of images exposed thereon without the need for special facilities such as dark rooms, and for extensive controls on time of exposure to light, developer type, or concentration.

In addition, it is well known that silver used in most photographic and reproduction processes is in short supply, thereby making it desirable to develop a commercial inexpensive non-silver halide process.

An object of this invention is to provide new, simple and inexpensive photosensitive elements useful for receiving latent or visual images as in photographic print or photocopy reproduction processes.

A further object of this invention is to provide new and useful methods for effecting photoreproduction of image forming objects using a minimum of liquid reagents.

A more specific object of this invention is to provide new types of photosensitized surfaces which are inexpensive and easily used in photo-reproduction work to effect simple, photocopy operations with a minimum of chemical treatment.

Other and different objects, features and advantages of this invention will become apparent to those skilled in the art upon consideration of the following detailed description thereof and the examples attendent thereto.

We have discovered that photosensitized oxidation, of a type previously known, may be used to produce a latent image in a suitable substrate by imagewise exposure of the substrate to light in the presence of light and proper photosensitizers. The latent image is in terms of non-migrating hydroperoxide groups differentially distributed in a film of a suitable matrix or binder of constraining properties. The hydroperoxide groups can be produced in direct proportion to the light intensity on each differential area. The latent image can be rendered visible by various development techniques dependent on the difference in properties between exposed and nonexposed regions.

In accordance with this invention, a base member is treated on at least one surface thereof with (1) a photochemically oxidizable substrate and (2) an organic photo-oxidizing sensitizer, which can absorb radiant energy from that portion of the electromagnetic spectrum between and including the near infrared and the ultraviolet to effect a transfer of oxygen from the surroundings to form a chemical bond between the oxygen and the substrate, said radiant energy being hereinafter referred to as "light" or "light energy." The resulting treated surface of this invention upon exposure to light applied through an image forming object generates a latent or visible image which can be fixed or developed by treating the light exposed treated surface with a suitable dye solution. For the purpose of this invention in preferred aspects, the photochemically oxidizable substrate (1) is defined as a coatable chemical substance containing or to which is added a photochemically oxidizable double bond system, said substrate being sufficiently stable under the conditions of use herein that it can be retained on a base support in the presence of air. Furthermore, upon exposure of the treated surface to light, said substrate can be chemically attacked by the excited state oxygen generated by the sensitizer (2) to effect chemical change in the substrate (1) sufficient to change the affinity or attraction of the substrate for the dye solution in the areas of chemical attack or which may be amplified or developed by organic solvents or other chemical reagents.

The photooxidizable substrate (1) may be any natural or synthetic material containing suitable carbon-to-carbon unsaturation, which material is spreadable on a suitable base support such as a glass or metal plate, a plastic solid or sheet, or a paper sheet or board surface, etc., and is sufficiently non-volatile at the temperature used. For use of this invention at ordinary room temperature the substrate material should have a molecular weight above about 140 so that it will not be removed from the surface or from the reaction site by migration in the oxidized form or by evaporation from the treated surface. The photooxidizable substrate may contain the suitable carbon-to-carbon unsaturation as part of its structure or molecules containing suitable carbon-to-carbon unsaturation may be added thereto. Higher molecular weight polymers or other materials may be used as a binder for low molecular weight materials containing the unsaturation to provide a suitably stable layer or film for imaging.

Natural materials which may be used include rosin and the double bond containing components thereof, terpenes such as abietic acid, neoabietic acid, maleopimaric acid, levopimaric acid, α-pinene, camphene, 3-carene, citronellol, aldehyde modified rosin materials such as formaldehyde modified rosins, and fortified rosin materials such as those obtained by reacting the rosin with alpha, beta-olefinically unsaturated polycarboxylic acids and anhydrides thereof, and partial and complete esters of such acids as maleic acid, fumaric acid, itaconic acid, aconitic acid, citraconic acid, etc., both saponified or unsaponified with an alkaline material. Other examples include the use of unsaturated fatty oils either in the glyceride ester form or in the free acid form. A few examples of such oils include olive, peanut, almond, neat's foot, pecan nut, lard, tung, safflower, cottonseed and soybean oils. Non-glyceride source unsaturated oils such as tall oil may also be used.

Unsaturated hydrocarbons of natural and synthetic origin, may also be used. Examples of such materials include the aliphatic olefinically unsaturated hydrocarbons having an average of at least about 10 carbon atoms, e.g., 1-dodecene, 1-tridecene, 1-tetradecene, 1-pentadecene, 1-hexadecene, 1-docosene, 1-pentacosene and the internally unsaturated olefins such as 7-heptadecene, 7, 10-heptadecadiene, etc., the aromatic olefinically unsaturated hydrocarbons in the unpolymerized form such as isopropenyl toluene, phenylisobutene, phenylhexadiene and isopropenyl naphthalene.

Natural and synthetic polymeric materials containing unreacted carbon-to-carbon double bonds therein may also be used as the photooxidizable substrate material in practicing this invention. The carbon-to-carbon unsaturation may be intralinear, e.g., -CH$_2$-CH=CH-CH$_2$-, a vinylene linkage, terminal, e.g., -CH$_2$-CH=CH$_2$ vinyl,

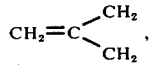

vinylidene and the like. Attached groups to the aforedescribed entities may be linear or branched. In general, the polymeric backbone will be hydrocarbon in structure with any halide, ester, ether, hydroxyl, nitrile, phenyl or other group present in the polymer molecule appended to the polymeric backbone.

It will be understood that the vinyl compounds are a species of vinylidene compounds since they contain the characteristic CH$_2$=CH- group, the indicated free carbon valence being satisfied by another atom in the polymer molecule. The term "vinylidene" is used herein to include both vinylidene and vinyl unsaturation.

Illustrative examples of these olefinically unsaturated polymers include natural rubbers; homopolymers, copolymers and polymers from three or more monomers prepared from diolefins such as butadiene, isoprene, 2,3-dimethyl-1,3-butadiene, piperylene, chloroprene, bromoprene, 2-acetoxy-butadiene-1,3, 2-methyl-pentadiene, 2-ethylhexadiene; and polymers prepared from diolefins such as those aforementioned and compounds containing a vinyl or a vinylidene group such as:

a. Vinyl ethers, e.g. vinyl alkyl ethers such as vinyl ethyl ether, vinyl butyl ether, vinyl octyl ether, vinyl dodecyl ether, vinyl tetradecyl ether, vinyl hexadecyl ether, vinyl octadecyl ether and vinyl alkenyl ethers, e.g., vinyl ether, vinyl octenyl ether, vinyl tetradecenyl ether, vinyl octadecenyl ether;

b. Vinyl esters, e.g. vinyl acetate, vinyl butyrate, vinyl caprylate, vinyl caprate, vinyl laurate, vinyl myristate, vinyl palmitate, vinyl stearate;

c. Vinyl halides, e.g. vinyl chloride, vinyl bromide;

d. Vinyl ketones, e.g. vinyl methyl ketone;

e. Vinyl sulfides, sulfoxides and sulfones, e.g. vinyl ethyl sulfide, vinyl propyl sulfoxide, vinyl tert-butyl sulfone;

f. Vinylidene compounds, e.g. vinylidene chloride;

g. Acrylic, methacrylic acids or crotonic acids and their derivatives, e.g. acrylic acid, acrylonitrile, methacrylamide, crotonamide;

h. Acrylic, methacrylic esters or crotonic esters, e.g. methyl methacrylate, ethyl acrylate, propyl acrylate, amyl acrylate, heptyl acrylate, octyl methacrylate, nonyl acrylate, undecyl acrylate, tetradecyl acrylate, hexadecyl acrylate, octadecyl acrylate, ethenyl acrylate, hexenyl methacrylate, dodecenyl acrylate, octadecenyl acrylate, ethyl crotonate;

i. Allyl esters, e.g. allyl acetate, allyl butyrate, allyl caprylate, allyl caprate, allyl laurate, allyl myristate, allyl palmitate, allyl stearate;

j. Allyl alkyl ethers, e.g. allyl ethyl ether, allyl octyl ether, allyl dodecyl ether, allyl tetradecyl ether, allyl hexadecyl ether, allyl octadecyl ether, and vinyl alkenyl ethers, e.g. allyl ethenyl ether, allyl octenyl ether, allyl tetradecenyl ether, allyl octadecenyl ethers;

k. Cycloaliphatic vinyl compounds, e.g. vinyl cyclohexane;

l. Aryl vinyl compounds, e.g. styrene, vinyltoluene, vinylbiphenyl, vinyl naphthalene and the ar-chloro substituted styrenes;

m. Heterocyclic vinyl compounds, e.g. vinyl pyridine and vinyl dihydropyrane;

n. Alpha-olefins, e.g. ethylene, propylene, butene-1, octene-1, dodecene-1, tetradecene-1, hexadecene-1 and heptadecene-1, dichloroethylenes, tetrafluoroethylene; and o. Branched olefins, e.g. isobutylene, isoamylene, 2,3,3-trimethyl-1-butene.

It is to be understood that the unsaturated polymers which are used in the practice of this invention can also be prepared by copolymerization of two or more different diolefins, e.g. from a mixture of butadiene and piperylene, either in the presence or absence of one or more non-dienic copolymerizable monomers.

The preferred vinyl or vinylidene monomers are those having at least one valence attached to an electronegative group such as a double or triply bonded carbon, e.g. vinyl, propynyl, or other groups such as phenyl, nitrile, carboxy and the like. The preferred vinylidene co-monomers are represented, e.g. by the classes of monomers listed hereinbefore in (a), (b), (c), (d), (g), (h), (k), (l), (m) and (o). The hydrocarbon vinyl monomers represented by monomers listed by monomer classes (l) and (o) are particularly preferred. The amount of copolymerized diolefin monomer in a copolymer of diolefin monomer and vinyl monomer is generally from about 0.1% to 99% by weight. However, when polymers of copolymerized diolefin monomer and vinyl monomer are used it is preferred that they contain at least about 1% by weight of copolymerized diolefin monomer.

The physical characteristics of the olefinically unsaturated polymers which can be photooxidized in accordance with the present invention may vary from low molecular weight polymer oils containing relatively few olefinic bonds to high molecular weight rubbers and resins such as those resulting from the polymerization or copolymerization of diolefins in the presence or absence of one or more nondienic copolymerizable monomers.

The sensitizers or photosensitizers as they are sometimes called herein, which may be used as component (2) in practicing this invention in general undergo no permanent chemical change. The sensitizer may be any organic compound or mixture of compounds which become excited by photon absorption and enter into a sequence of chemical reactions with atmospheric oxygen causing a photochemical oxidation reaction to occur in which the substrate (1) becomes oxidized and the sensitizer is generally regenerated at the end of the cycle.

Preferred photosensitizers used herein are referred to generally as being of the porphyrin type. The porphyrin type of photosensitizer may be described as any compound having the porphin structure, i.e., four pyrrole rings connected by single carbon or nitrogen atoms, which includes related compounds such as the prophyrazines, phthalocyanines or chlorophylls.

Particular photosensitizers useful in practicing the present invention are the aromatic group meso-substituted porphin compounds. Among such aromatic substituted prophins are the ms-tetraarylporphins (ms-meso). These compounds are those porphins in which aryl groups having from 6 to 24 carbon atoms are substituted on the bridging carbon atoms of the porphin ring structure which contains four pyrrol nuclei linked together in a circular pattern by four bridging carbon atoms to form a great ring. Examples of aryl groups which may be substituted in the meso-position of these compounds are phenyl, chlorophenyl, dichlorophenyl, methylphenyl, N,N-dimethylaminophenyl, hydroxyphenyl, naphthyl, biphenyl, anthracyl, phenanthryl, etc. In addition to the substituents in the aryl group substituents noted above, the aryl groups can also have any or a combination of such substituents, e.g., as alkyloxy (1 to 20 carbon atoms) substituents such as methoxy, ethoxy, isopropoxy, butoxy, hexyloxy, etc., as well as any other substituents which do not change the fundamental aromatic character of the groups. These porphin sensitizers including the above exemplified arylporphins, can have various other substituents, particularly at the beta and beta' positions of the pyrrole rings, e.g., such substituents as lower alkyl (1 – 20 carbon atoms) such as vinyl or allyl or alkanoic acid groups such as methylcarboxy or ethylcarboxy.

Examples of porphin compounds which are useful as photochemical sensitizers in practicing this invention are the arylporphins such as the tetraphenyltetrazoporphins and the complexes thereof, such as diamagnetic complexes, e.g., magnesium tetraphenyltetrazoporphin, tetraphenyl tetrazoporphin acetate, tetraphenyltetrazoporphin sulfate, zinc tetraphenyltetrazoporphin, and the meso-aryl porphins including alpha, beta, gamma, delta-naphthylporphin and the diamagnetic metal chelates thereof, e.g., tetraphenylporphin
tetrakis(2,4-dichlorophenyl)porphin
tetrakis(2-furyl)porphin
tetrakis(4-methoxyphenyl)porphin
tetrakis(4-methylphenyl)porphin
tetrakis(2-thienyl)porphin
tetraphenylporphin zinc complex
tetrakis(4-nitrophenyl)porphin
tetrakis(4-dimethylaminophenyl)porphin
zinc complex;

the tetrabenzomonoazo- and tetrabenzodiazo porphins, the 1,2,3,4,5,6,7,8-octaphenylporphins and azoporphins such as octaphenylporphyrazine, the tetrabenzoporphins, e.g., tetrabenzoporphin and the zinc complex of tetrabenzoporphin.

Other useful porphin types of photosensitizing materials which may be used include chlorophyll, such as chlorophyll $a$ and chlorophyll $b$, hemin, the tetrazoporphins, chlorophyllin salt derivatives such as the reaction product of an alkaline metal chlorophyllin salt and sodium bisulfite, hematoporphin, mercury proto- and hemato-porphins, vitamin $B_{12}$ and its derivatives and tetrakis (1-naphthyl) prophin.

Related porphin type materials which may be used include the phthalocyanines including the metal-free phthalocyanine and metal complexes of phthalocyanine such as the zinc and magnesium complexes of phthalocyanine, as well as phthalocyanine derivatives such as the barium or calcium salts of the phthalocyanine sulfonic acid, acetylated phthalocyanine, alkoxy- and aryloxy-benzosubstituted phthalocyanines, 5,5′,-5″,5‴-tetraamino-metalphthalocyanine-4,4′,4″,4‴-tetrasulfonic acid, magnesium tetra(4)methylthiophthalocyanine, arylthioethers of phthalocyanines, vinyl group containing tetraazoporphins and polymers thereof, mercaptoamino phthalocyanine derivatives and phthalocyanine.

Other useful photosensitizers which can be used include fluorescein type dyes and light absorber materials based on a triarylmethane nucleus. Such compounds are well known and include Crystal Violet, Malachite green, Eosin, Rose Bengal and the like.

Another group of photosensitizers particularly useful in the ultraviolet region include the aromatic compounds such as acetophenone, benzophenone, benzoin, benzil and triphenylene.

Light necessary in the practice of this invention can vary considerably in wave lengths, depending on the sensitizer in this system. The light can be monochromatic or polychromatic. Light of wave lengths in the range of 3,600 to 8,000 Angstroms has been found very suitable.

The present invention is concerned with the use of a photochemical oxidation of organic carbon-to-carbon double bonds in the substrate in a manner which makes this phenomenon useful for photo-reproduction purposes. The photooxidizable substrate (1) and the photo-sensitizer (2) are put together on a suitable surface, light is brought to bear on the treated surface in an amount in controlled areas to effect photooxidations of discernible intensities and then the photochemical reaction is stopped by removal of intense light. The extent of oxidation which is allowed to occur may vary widely depending upon the substrate (1) and the sensitizer (2), and the dye receptivity characteristics of the oxidized substrate. For example, a substrate (1) such as a polyisoprene polymer coated on a desired surface will require more oxidation to make a bright image than will a substrate consisting of a polymer of 60 parts of styrene and 40 parts of butadiene because of the difference in the dye receptivity characteristics of the two substrates. With substrates such as styrene-butadiene containing polymers containing about 60 parts of styrene and about 40 parts of butadiene, and optionally containing small amounts of other functional monomers such as itaconic acid or anhydride, oxidation sufficient to provide for the uptake of about $10^{-9}$ to about $10^{-7}$ moles of oxygen per square centimeter of coated surface is generally quite suitable for producing an intense image upon treating the surface with a dye. Generally, developable images can be obtained when oxidation has occured to an extent sufficient to provide for the uptake of about $10^{-2}$ to about $10^{-10}$ moles of oxygen per square centimeter of substrate surface. The depth of the oxidation into the substrate is not known. However, as an example, with the above referred to styrene-butadiene polymer substrate, oxidation to the extent of $10^{-8}$ to $10^{-9}$ moles of oxygen/per square centimeter uptake by the polymer corresponds to a minimum coating depth of about 250 to 500 Angstroms if all of the double bonds in the polymer were oxidized. It will be recognized that in this application of the photooxidation reaction to the weight concentration of the photosensitizer (2) relative to the weight concentration of the organic carbon-to-carbon unsaturated photooxidizable substrate (1) need only be quite small for the desired purpose. It is not necessary to effect oxidation of all of the available unsaturation in the substrate, that is, it is not necessary to oxidize all of the carbon-to-carbon double bonds in the substrate. It is sufficient that enough of such oxidation takes place to permit the formation of developable latent images which can be made visible by treating the oxidized surface with a dye, or by other methods.

The photosensitizer (2) and the photooxidizable substrate (1) may be applied to the desired surface separately, or as a single composition by conventional methods such as incorporation in a suitable diluent emulsion technique. They may also be applied with suitable pigments wherein the photooxidizable material (2) acts not only as the photooxidizable substrate but also as a component of a pigment binder or adhesive. A typical example of a useful polymeric composition used for this purpose is a 48% solids styrene/butadiene aqueous latex emulsion used either alone or in combination with starch or casein type materials as pigment binders in the coating of paper surfaces to make high quality printing papers. Within the scope of this invention a coating composition is prepared so as to contain a small amount of the photosensitizer, e.g., tetraphenylporphin, a pigment or mixture of pigments, typically a kaolin clay and titanium dioxide and a binder or adhesive, e.g. an aqueous latex of styrene/butadiene copolymer, the total solids content in such composition ranging from about 10% to 70% by weight. The coating composition may be applied to a suitable paper sheet or board, or to a metal, plastic or glass article of manufacture may be used immediately or stored, and packaged for future use for effecting photocopying according to this invention.

It will be appreciated by those skilled in the art that the selection of the diluent or other means used with the photosensitive compositions will depend upon the nature of the substrate being treated and the photosensitizer being applied in order to obtain a complete surface coverage.

Exemplary of the diluents which may be used alone or in combination with the photosensitizer compositions of this invention are chlorinated hydrocarbons such as ethyl chloride, methylene chloride, chloroform, carbon tetrchloride, trichloropropane, monochlorobenzene, trichloroethylene, perchloroethylene, difluorodichloro-methane, ortho-chlorobenzene, chlorinated polyphenyls, chlorinated paraffins and the like; hydrocarbons such as heptane, hexane, cyclohexane, eiscosane, octadecene, benzene, xylene, toluene and the like; polyethylene glycols, butyl cellosolve; esters such as methyl acetate, ethyl acetate, carbitol acetate, di-2-ethylhexyl phthalate, dimethyl phthalate, dimethyl cellosolve phthalate, ditetrahydrofurfuryl phthalate and the like; acetone, methylethyl ketone, cyclohexanone, undecanone, etc.; dibutyl stearate dimethyl sulfoxide and the like.

When the photooxidation reaction has progressed to the desired extent for photo-reproduction purposes of this invention, the reaction may be essentially stopped by removal of the photoreproductive element, i.e., the element containing the combination of photooxidation sensitizer (2) and the photooxidizable substrate (1) from intense light. Usually from about 10 seconds, say up to about 60 seconds exposure to the equivalent of the light energy absorbed from a 1000 watt white light, 12 inches away from the photo-reproduction element is sufficient to induce a photochemical reaction suitable for making a clear print of the object to be copied.

The dyes used in this invention to fix or develop the images produced in the photo-oxidation step of this invention may be any dye which has varying affinities for oxidized and non-oxidized sites on the light exposed treated surface. Dyes generally found useful in this invention are the organic soluble or oil soluble dyes such as the alcohol soluble dyes or kerosene soluble dyes, e.g., the triphenylmethane type, azo dyes and disperse dyes. We have found that dyes dissolved in a solvent such as deodorized or highly refined kerosene are directed generally to the non-oxidized portion of the exposed treated surface and that dyes dissolved in an alcohol such as 2-ethylhexanol are directed chiefly to the oxidized portions of the exposed treated surface. The particular site at which the dye locates itself appears to depend on the selective swelling characteristics of the solvent used, the effect of the dye on the solubility parameter of the solvent, and on the polarity of the dye. Although these factors appear to control the direction of the dye, the actual chemical or physical mechanism of the direction and image application brought by the dye is not fully understood.

The solvents or dispersants which are used for the dye may be any organic material which will (1) dissolve or disperse the dye and which will aid in selectively directing the dye to the oxidized or non-oxidized regions of the exposed treated surface so that the differences in photooxidation in the various areas of the surface can be readily made apparent thereby. Suitable solvent or diluents for the dyes which can be used include low melting molten waxes, liquid alkanes, cycloalkanes, alkanes mixed with aromatic compounds such as benzene, toluene, xylene, chlorobenzene, etc., aliphatic fatty acids having from 6 to 24 carbon atoms, molten unsaturated fatty acids such as palmitic acid, higher liquid aliphatic alcohols having from 6 to about 20 carbon atoms, and such higher alcohols mixed with up to about 50% of lower alcohols, aliphatic esters which are liquid or low melting (below 100° C) solids at room temperatures such as triacetin, ethyl hexanoate, methyl oleate. The dyes may be used in any desired concentration in the solvent or diluent but a solution containing about 0.1 to about 6 percent of dye by weight in the selected solvent is generally sufficient for most fixing or developing purposes of this invention. The dyes may also be applied as a solid.

Examples of dyes found in the Colour Index which are useful for amplifying or developing latent images produced with a positive image forming object, e.g., a typewritten opaque white sheet, include Sudan Brown, Sudan Red, or Calco Oil Red dissolved in deodorized kerosene. Examples of dyes useful for amplifying or developing latent images produced with a negative image forming object, e.g., a photographic negative film, include Crystal Violet, Malachite Green, Victoria Blue or Nigrosine B dissolved in 2-ethylhexanol.

The site to which the dye is directed depends both on the dye and the solvent. For example, Sudan Brown dissolved in kerosene goes preferentially to the non-oxidized site. A strongly basic dye like Crystal Violet goes preferentially to the oxidized sites except at sites where higher amounts of oxidation have occurred. In those areas of higher oxidation inversion appears to occur with the dye being rejected at too highly oxidized sites.

The dyes may be simply wiped on the exposed photooxidized elements as with a rag, brush, or sprayed on or applied by other conventional methods, and then dried as by wiping the dye treated surface with a dry cloth or tissue. The result is a clear, useful print or copy of the object to be copied or reproduced.

Chelates, graphite, metal oxides as solids and the like may also be used on the exposed photooxidized surfaces to prepare the desired products and are picked up because of differential tack produced by photooxidation.

The photosensitizers (2) used in practicing this invention may be used alone or in combination to make more effective use of the incident light spectrum radiation, so long as the combined sensitizers do not quench or neutralize the light absorbing ability of each other. For example, Rose Bengal and Methylene Blue may be used as sensitizers in combination with the preferred porphin type of sensitizers such as tetraphenylporphin. Suitable base or support materials include metals, e.g., steel, aluminum plates, zinc, copper, magnesium, sheets and foils, glass, wood, paper, composition board, cloth, cellulose esters, e.g., cellulose acetate, cellulose propionate, cellulose butyrate, etc., the films or plates composed of various film-forming synthetic resins or high polymers, such as the addition polymers, including those mentioned in both monomeric and polymeric form for use in the photooxidizable layer and in particular the vinylidene polymers, e.g., the vinyl chloride copolymers with vinyl chloride, vinyl acetate, styrene, isobutylene and acrylonitrile; the linear condensation polymers such as the polyesters, e.g., polyethylene terephthalate; the polyamides, e.g., polyhexamethylene sebacamide, polyester amides; e.g., polyhexamethylene adipamide/adipate, etc. Fillers or reinforcing agents can be present in the synthetic resin or polymer bases such as the various fibers (synthetic, modified or natural) e.g., cellulosic fibers, for instance, cotton, cellulose acetate, viscose rayon, paper; glass, wood; nylon and the like. These reinforced bases may be used in laminated form.

The imagery process of this invention which makes use of visible light, a photosensitizer composition and a substrate such as styrene-butadiene is capable of producing a latent image by using reflex, reflective and transmittive systems. The latent image so prepared is made visible by suitable dye systems to produce high quality continuous tone pictures.

The latent image may also be used to selectively deposit finely divided solids, metals and/or metal oxides and chelates. If graphite is used, it may be used as a conducting base for electroplating metals. If natural rubber is used as the substrate, the unexposed area may be selectively dissolved to produce a relief image. Multicolor images are also contemplated by the practice of this invention.

The compositions of this invention have a wide utility and are generally useful in the graphic arts, wherein a reproduction of a drawing, design, plan, etc., is desired. Thus, in the manufacture of templates for use in preparing parts of airplanes, automobiles, boats, radio and electrical equipment, etc., the materials to be used, such as steel, aluminum, etc., are coated with the light-sensitive compositions of this invention, dried, exposed through the master drawing and developed. The finished print is an exact reproduction of the original and adheres firmly to the metal or other material. Stencils or lettered transparencies may also be used to reproduce directions, identification numbers, etc., on parts of finished articles of manufacture. The photosensitive film elements of the present invention may also be used as print stock in the production of black and white prints.

The photosensitized layer is exposed to light, generally through a process transparency, e.g., a process negative or positive (an image-bearing transparency consisting solely of substantially opaque and substantially transparent areas where the opaque areas are substantially of the same optical density), the so-called line or halftone negative or positive.

It is possible to expose the photosensitized layer through paper or other light transmitting materials. A stronger light source or longer exposure times must be used, however. Reflex exposure can also be used, e.g., in copying from paper or translucent films.

Light sources suitable for use in the practice of this invention include carbon arcs, tungsten and mercury-vapor arcs, fluorescent lamps, argon glow lamps, electronic flash units, photographic flood lamps and sunlight.

The present invention is particularly concerned with imaging procedures utilizing photosensitized oxygen transfer reactions in which light in the presence of a sensitizer causes the oxygen to oxidize the carbon-to-carbon unsaturated substrate by being added to one carbon atom of a double bond with shift of the double bond to the allyl position and movement of the allylic hydrogen atom to the oxygen atom of the oxygen molecule which is not attached to the carbon atom. The reaction can be postulated:

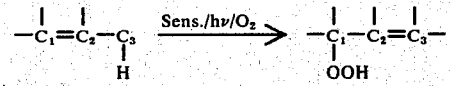

The aforesaid oxygen transfer reaction does not include autooxidations, proceeding by a free radical mechanism in which irradiation with light serves to initiate free radicals and cause the formation of free radical sites in the substrate by hydrogen abstraction. The true photosensitized oxidation or oxygen transfer reactions used herein are characterized by the fact that they can proceed using wavelengths of light which may be ineffective for autooxidation and by the fact that in general ordinary oxidation inhibitors do not retard the reaction.

The photosensitized oxygen utilized herein involves what is referred to by Gollnick and Schenck (K. Gollnick and G. O. Schenck, Pure and Applied Chemistry, Vol. 9, 507 [1964]) as a Type 2 reaction, or "photosensitized oxygen transfer." The reaction involves some excited oxygen species, whether pictured as an oxygen molecule itself in an excited singlet state, or an excited sensitizer-oxygen adduct. Irradiation with light appears to transform the sensitizer to an excited state, such as a triplet state:

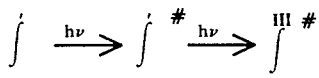

The sensitizer then transfers its energy to oxygen. This can be postulated as

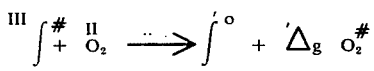

and the excited singlet delta oxygen can then add to the double bond as pictured above. It should be understood that if the triplet energy of the sensitizer is above 37 kcal., single sigma oxygen may also be produced. It may react directly or decay to the lower energy delta species. The reaction involves light energy to excite the sensitizer and produce an excited state oxygen which reacts with the substrate to cause addition of oxygen to one of the doubly-bonded carbon thereof. The reaction ordinarily does not include any chain propagation, but only one oxygen addition per photon absorbed at quantum yield of unity. The photosensitized reaction can proceed using wave lengths of light other than ultraviolet, and ordinary oxidation inhibitors do not inhibit the reaction. A sensitizer-oxygen adduct is presumably formed but is apparently short-lived; however it should be understood that the oxidation is effective regardless of what the mechanism and exact contribution of the adduct to the oxidation of the olefin may be.

In another aspect, the present invention can utilize an oxidation reaction in which a hydrogen atom is abstracted to give a radical and oxygen is then added. For example the Type 1 reaction in the foregoing Gollnick and Schenck article involves a reaction in which the allylic hydrogen atom at C-3 is abstracted to give a mesomeric mono-radical

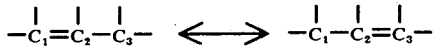

and oxygen is then attached at either of radical sites $C_1$ or $C_3$, and the peroxyradicals thus formed extract hydrogen from the C-3 position of the olefin to give hydroperoxides and a new mesomeric radical, thus permitting chain propagation. Sensitizers which are voracious hydrogen abstractors when excited by light energy are suitable for use in such reaction. One group in such a class is the carbonyl compounds, as for example, benzophenone, acetophenone, etc. Aside from olefins containing allyl hydrogen, other types of materials containing labile hydrogen can undergo reactions similar to that of Type 1 to produce materials containing hydroperoxy groups, and such materials can be used for photoimaging in accordance with this aspect of the invention, for example, such materials as ditetrahydrofurfuryl phthalate, d-2-ethylhexyl phthalate, compounds containing tertiary hydrogen, etc. If such materials are liquid they will generally be used in conjunction with a polymer or some other high molecular weight binder to provide a suitable matrix. In oxidations involving abstraction of labile hydrogen to generate free radicals, other reactions such as cross-linking can also occur and may interfere with the desired photoimaging reaction, and such oxidations, while part of the present invention and useful to some extent, are not in accord with the preferred aspects of the present invention.

Sensitizers which can function in both Type 1 and Type 2 reactions include benzophenone, acetophenone, benzil, benzoin, etc. These carbonyl type sensitizers require ultraviolet light of suitable wave length for excitation. Sensitizers which also function in both Type 1 and Type 2 reactions, but are active in the visible region as well as the ultraviolet region of the spectrum include eosin, fluorescein, rose bengal, etc. Sensitizers which are not hydrogen abstracters and which function largely or wholly by energy interchange as in Type 2 reactions, include the various porphyrin type photosensitizers. In general photosensitizers capable of Type 2 sensitization are much preferred, and ordinarily the better ones of this Type are not very effective as Type 1 photosensitizers. Moreover, the absence of Type 1 activity minimizes side reactions. There will be variations in the effectiveness of sensitizers with the physical type of phase involved and more generally its environment and it will be understood that the sensitizers utilized herein will be those effective under the conditions of use. The sensitizers described above are known to function in liquid phase. In the practice of this invention some systems have involved the post-application of a sensitizer-solvent system to an already pre-formed film. The resulting system can be called a quasi-solid phase as it consists of a solid polymer lightly swollen with a swelling solvent system. In such a quasi-solid phase, the sensitizers listed above and similar photosensitizers are found to effect photochemical addition of oxygen, although with great variation in effectiveness. In the practice of the invention it is also feasible to use solid phase systems in which the sensitizer has been incorporated into a polymeric film composition which has not been swollen by solvent. In the solid phase such sensitizers as rose bengal, fluorescein, eosin, methylene blue, etc. did not exhibit significant photoimaging capability in reasonable exposure times. Benzophenone, acetophenone, benzil, etc., were found to require high level of application, circa 10%, and prolonged exposure, circa 30 minutes at ultraviolet flux of $7\times10^5$ ergs/cm$^2$/sec. in order to show substantial photoimaging capability. In contrast to this, porphyrins, such as tetraphenyl porphin are very active at levels as low as 0.1% at a flux of $2.5\times10^5$ ergs/cm$^2$/sec. for 1 to 2 minutes. Triphenylene in the solid phase seems to function largely by cross-linking, making it of little value for continuous tone image production.

The photosensitizers can be placed in solid phase by incorporation into a coating solution, emulsion, melt, or suspension etc. and application to a support. After evaporation, drying, or other means or removing volatile solvents or other liquid medium, the photosensitizer remains in the residual coating composition dispersed in solid form in the solid composition. Even if the photosensitizer is incorporated by post-application with a solvent, it can be converted to the solid state by permitting the solvent to evaporate. For ease of handling and reproducibility, it is preferred that the photosensitive compositions be dry at the time of photoimaging. It will be recognized that in referring to the photosensitizer as being in a solid medium, it is not meant to exclude such resilience, elasticity or other properties as may be desirable in photosensitive films for various purposes, and that plasticizers or low molecular weight materials may be present for such purposes. Thus the solid state contrasts with the quasi solid state in which liquid is present to swell the polymer structure as in a plastisol or organosol and to provide a liquid medium in which the photosensitizer can be present, aside from how much of the photosensitizer is actually present in such medium.

The photosensitizer as employed will generally be of a type suitable for producing a desired amount of oxygen addition in the particular photosensitive composition upon degrees of light exposure within ranges of practicality for some photoimaging applications. For most applications it will be desirable that a required energy absorption be not greater than $10^7$ ergs/cm$^2$, or possibly $10^8$ ergs/cm$^2$ in some applications, and preferred that such absorption be sufficient with a concentration of photosensitizer no greater than 1% by weight of the photosensitive composition, for example with a flux sufficient to obtain such absorption over a 2-minute exposure period. The energy required for imaging will generally lie in the range of 1 to $10 \times 10^6$ ergs/cm$^2$. Absorptions with usual imaging procedures are frequently of the order of $2.5 \times 10^4$ erg/sec./cm$^2$. The foregoing energy ranges are those generally employed with the concentrations of photosensitizer generally used, but increasing the concentration makes it possible to use shorter exposure time for the photoimaging as the imaging requirements are approximately in inverse proportion to the photosensitizer concentration. The use of various amplifying means also makes it possible to lower the energy requirements. In order to have practical value in a photoimaging system, a photosensitizer as used should produce an oxygen uptake of at least about $10^{-9}$ moles/cm$^2$ with an absorbed energy of $10^7$ ergs. A styrene-butadiene polymer (40 wt. parts styrene/60 wt. parts butadiene) film can suitably be used for determining oxygen uptake at particular energy absorptions.

Only a portion of the applied light flux will be absorbed by the sensitizer, with that portion varying with the absorption characteristics of such sensitizer, as well as with the wave length of the light. Absorptions may, for example, be less than 10%, or of the order of 7% in some cases. Visible light can effectively be used in the present invention, and this is a definite advantage as it avoids the cost and loss in efficiency which results from having to produce light in particular ranges, such as the ultra violet range. In the present invention it is not necessary to utilize the ultra violet range, and in fact, the range of 4,000 to 4,500 angstroms appears most efficient. If desired, light in ranges above 4,000 angstroms can be used to avoid possible ultra violet catalysis of competing reactions, although this is not ordinarily necessary. While visible light is effective, the present materials can generally be handled in ordinary daylight, such as by removing the photosensitive material from the intense light used for exposure, and carrying out development or other steps without special precaution to avoid further exposure to ordinary ambient light.

The preferred sensitizers for use herein belong to the class of porphyrins which are compounds with pyrrol rings linked together by carbon atoms to form a conjugated double bond structure, and in which one or more of the carbon atoms, i.e. methine groups, can be replaced by a nitrogen atom, and which class also includes the phthalocyanines and benzoporphyrins, as well as the meso-arylporphyrins, or other compounds having various substituents on the basic porphyrin structure. The tetraaryl porphyrins, particularly tetraphenyl porphyrin, are characterized by the capability to utilize energy from three of the main areas of the visible light spectrum, i.e., the blue, green and red areas and therefore to make efficient use of light energy. Such sensitizers can be termed panchromatic photooxidation sensitizers and are particularly valuable. Some other sensitizers are active only in limited areas of the spectrum, for example chlorphyll absorbs mainly in the red region. Aside from efficiency, the panchromatic sensitizers are advantageous for multi-color work in that it makes it possible to use a single sensitizer for exposure to reproduce different colors from an original, rather than having to change sensitizers for each of the main segments of the color spectrum. Tetraphenyl porphyrin absorbs most strongly in the violet, and less in the green and least in the red, which is advantageous in that visible light is the reverse, being strong in the red, etc., and therefore the sensitizer compensates for the variation in light-intensity and tends to equalize the effect of different intensities. Utilizing the panchromatic sensitizers, the present invention produces images from multi-color transparencies. If polychromatic light is used with a single exposure, the resultant image will not ordinarily exhibit appreciable differentiation between the colors, but the image produced will have parts corresponding to the various colors. The image can be developed by applying a single dye to give a monochromatic image, e.g., red and white, or by using a solvent to dissolve areas either corresponding to the colored regions or the non-colored regions. The present invention also works for the production of multi-color images. For example color separations can be used to provide separate exposures for the different colors, and the exposures can then have colors applied to correspond to the original, coloring either the oxidized or the non-oxidized areas. The exposures can then be assembled in register to provide a multi-color image corresponding to an original. A laminate of appreciable thickness is thus provided having portions which have been hydroperoxidized by image-wise exposure to light, and with coloring materials present in either hydroperoxide portions or non-hydroperoxide portions to present an image to the viewer. In this particular embodiment the hydroperoxide areas corresponding to different colors are present at different levels in the laminate. Other expedients may be employed to provide oxidized or non-oxidized areas in an image with colors of proper correspondence to an original.

For the production of images of practical value, an uptake of about $10^{-9}$ moles oxygen per cm$^2$ is ordinarily required and usually is in a range from $10^{-9}$ to $10^{-6}$ moles oxygen/cm$^2$. The oxygen is incorporated into the molecules of the coating as chemically-bonded oxygen. The bonded oxygen is more concentrated on the surface with generally decreasing concentration with depth into the film, e.g., the concentration per cm$^3$ measured at a 5 micron depth may be about double that measured at a 10 micron depth, although the relationship is generally a non-linear curve. If the $10^{-9}$ moles is considered as distributed in a 10 micron thickness, the average concentration is $10^{-6}$ moles/cm$^3$, or about $10^{-6}$ moles O$_2$/gram of film, assuming the film has a density near one. An exemplary styrene-butadiene polymer substrate can have about 2 butadiene moieties for styrene moiety, and the gram molecular weight of this -B-S-B- unit is 212. Thus there is about 0.000212 moles per polymer unit, and the uptake of $10^{-9}$ to $10^{-6}$ moles O$_2$ per cm$^2$ represents 0.000212 to 0.212 moles oxygen, or hydroperoxy groups, per -B-S-B- unit in the polymer. This can also be expressed as a range from about 1 hydroperoxy group for every 50,000 carbon atoms in the polymer up to about one hydroperoxy group for every 50 carbon atoms in the polymer. While there will be variances in the degree of desired oxidation with different polymers, the foregoing is largely a matter of the concentration of hydroperoxy groups (or moles of oxygen combined) in the quantity of material (in the 10 micron film), and will be generally valid regardless of the particular polymer. If the film contains non-photooxidizable polymers or other materials, as well as the photooxidizable polyer, the above ratios of hydroperoxy groups can be considered on the basis of the carbon atoms in the total composition, so as to have about $10^{-6}$ to $10^{-3}$ moles O$_2$ per gram of film. While the amount of oxidation will generally be within the foregoing ranges, it is to be understood that higher degrees of oxidation can be employed, up to 100% of that theoretically possible for oxidation of all photooxidizable unsaturated groups, but the use of degrees of oxidation higher than the foregoing does not ordinarily result in advantageous changes in the property attributes significant for photoimaging. The desired degree of oxidation will depend to some extent on the type of development contemplated, e.g., solvent dissolution development may require more oxidation.

It is known that various kinds of reactions can be catalyzed by light and that various kinds of reagents influence the cause of such reactions. Thus such reactions as photopolymerization, or photo cross-linking have been used for photoimaging purposes. Under some conditions some of the sensitizers and oxidizable materials employed herein are capable of undergoing such reactions. However, under the conditions and with the components utilized herein such competing processes are minimized or eliminated and the predominant reaction utilized herein is that involving addition of oxygen with chemical bonding to an organic substrate. Thus the materials employed herein will generally not involve any materials with readily polymerizable monomers, at least not with sensitizers apt to cause polymerization thereof, and an ample supply of ambient oxygen will be present to permit the desired photooxidation, and also to some extent to serve to inhibit polymerization or cross-linking in the case of some components prone to such reactions. Any cross-linking or polymerization which accompanies the predominant oxidation reaction will desirably be very minor in nature and not result in appreciable changes in properties of the composition, as for example, not causing any substantial change in solution viscosity of such polymer. Such reactions as chain scission, cross-linking, and carbonyl formation are possible side reactions which are ordinarily minor in nature, and may not even involve the sensitizers employed herein, but simply be possible side reactions which can occur upon exposure of some kinds of substrates to light. It is to be recognized that addition of oxygen in accordance herewith will generally produce hydroperoxy groups as taught herein.

The photoimaging procedure of the present invention causes a gradual change in properties with the intensity of the light exposure and is well suited for the production of continuous tone images, e.g. for producing prints of ordinary pictures, as well as for half-tones or stencils. The degree of hydroperoxidation increases directly with the light exposure, and a graph of image density vs. light exposure shows a gradual curve over a considerable range, rather than a steep slope. In this respect the present process contrasts with many processes involving solvent development of a latent image produced by cross-linking or polymerization, in which the polymeric material is usually either soluble or insoluble, without much gradation therebetween. Aside from the chemical bonding with oxygen, and allylic shift of the double bond, the molecular structure of the substrate is essentially unchanged by the imaging procedure, i.e., the polymeric chains are ordinarily substantially the same length and configuration as in the substrate prior to imaging. There may be some minor cross-linking isomerization, or scission, and some minor loss in unsaturation, but not in quantities sufficient to change significantly such polymer attributes as molecular weight, etc. Characteristically, most of the polymers employed are soluble in toluene, benzene, etc., both before and after exposure. There are, of course, some solubility changes due to the presence of the polar hydroperoxy group, but the toluene solubility is as stated. To have particular coating properties, it may at times be desirable to utilize a polymer substrate having some cross linking in its structure, but the post-imaging structure will in such case still be substantially the same as the pre-imaging structure. For most applications it will be desirable to utilize essentially linear structures, or those having only a moderate or light amount of cross-linking. When development by solvent dissolution is contemplated, the polymer structure and solubility should be matched with the proposed developing solvents. Even when dye development is contemplated, the structure has some significance, as cross-linking has some influence on the degree to which dye-containing solvents are absorbed by the polymer. For some applications it is preferred to utilize essentially linear polymers, and to produce by the imaging procedure essentially linear polymers containing hydroperoxy groups. While the photoimaging procedure does not cause cross-linking, it is possible by other or further treatments to bring about cross-linking. For example, thermal treatments can be employed to cause reactions of the hydroperoxy groups with cross linking.

In the photooxidation of the present invention the oxygen becomes bonded to one of the carbons of the polymer substrate, but the double bond is retained in the polymer. There may be some loss of residual unsaturation in the polymer, but it should be minor compared to the oxidation, and the major proportion of such unsaturation will ordinarily still be present after the exposure. In common photopolymerization or photo cross-linking procedures, double bonds are utilized in a polymerization or cross-linking procedure, and are to some extent used up in such reactions, so that the residual unsaturation is much less after imaging than before imaging. In the preferred aspect of the invention the hydroperoxy group is formed on one of the carbons of the original double bond, with an allylic shift, so that in final conformation the hydroperoxy group is in the allyl position with respect to the double bond. The latent photoimages produced in the present invention are formed of hydroperoxy groupings, particularly allylic hydroperoxy groupings, which can be developed in various ways as taught herein. Developability is generally based upon the hydroperoxy group, so the image can still be developed if the allylic group should become saturated.

Dyes, pigments, or other coloring materials can be used for developing images in accordance with the present invention, and the colorents or coloring materials can be chromatic or achromatic and include the various colors of the spectrum.

The photoimaging in the present invention depends upon the change in properties caused by addition of oxygen to molecular structures of the photosensitive substrate, and appears to a considerable extent to be due to the polarity of hydroperoxy groups in such molecules. The photooxidation makes possible differentially profound point-by-point property changes in a film due to differential distribution of non-migrating hydroperoxy groups in such film. The differential distribution of hydroperoxide accurately reproduces the intensity of light to which each differential area was exposed and the difference in chemical and physical properties of the hydroperoxidized regions compared to the non-exposed regions results in a latent image which can be rendered visible by difference in dye sorption, solubility, surface tack or other properties. For the differences caused by the photooxidation to be most evident, it is desirable that the original photosensitive composition not have groups with properties similar to hydroperoxides, although some such groups can be tolerated, even though contributing to an objectionable background in some photoimaging procedures. Such polar groups as carboxy, hydroxyl, nitrile, etc. may mask the photoimaging effect of hydroperoxy groups to some extent. For this reason some of the preferred polymers for use herein are hydrocarbon polymers with residual unsaturation, e.g., styrene/butadiene copolymers, etc. However, for the effect upon the original solvent solubility, or upon mechanical film properties it may at times be desirable to use polymers having various substituents, such as halogen, nitrile, carboxyalkyl, etc. and polymers containing such substituents can be used if some loss in photoimaging sensitivity can be tolerated in the particular application in view. In general it will be preferred that polar monomers not constitute more than three-fourths of the monomer content of a copolymer used as the photooxidizable substrate in the present invention.

To be effective for photoimaging, the hydroperoxy groups formed should not migrate appreciably from the relative position in which they were formed. In general this does not constitute any problem with the polymeric systems generally employed herein. However, it can be appreciated that an oxidizable material dissolved as a free-flowing solution would have little value as such as a photoxidizable substrate. Ordinarily any film forming materials can be used in the photosensitive compositions of the present invention to provide a stable matrix to prevent migration of the oxygen-containing substituents. Polymers of the various types disclosed herein as substrates can be used, as can various other film forming materials. Even relatively low molecular weight non-volatile materials containing carbon-to-carbon double bonds can be used as the photooxidizable component in conjuction with other suitable binder materials sufficient to provide a stable layer or stratum of photoimaging. In general coating compositions with sufficient binder materials to provide a stable coating or film will have a suitable matrix to prevent undue migration of oxidizable materials in such compositions. Of course, some of the materials disclosed herein have both the needed oxidizable groups and the properties suitable for forming stable films or coatings, e.g., high molecular weight polymers containing residual unsaturation, such as styrene/butadiene copolymers. Thus in general there will be no need for using separate binder materials, but the use of such are fully consonant with the present invention. Even though a particular polymer in itself has all the properties necessary to serve as a photooxidizable substrate, it may nevertheless also be used in conjunction with other polymeric binder materials which do not have photooxidizable groups; or in conjunction with other materials which do have such photooxidizable groups.

Aside from characteristics of the photosensitive compositions for forming latent photoimages in accordance herewith, various other mechanical or other properties of the polymers will have significance with respect to ease of coating application, durability and handling properties of the film, but in general those skilled in the art will be able to select appropriate materials for particular applications, particularly in view of the present disclosure.

One class of polymers suitable for use herein are solid, substantially linear materials having a weight average molecular weight of at least 50,000 and having at least one carbon-to-carbon double bond with an allylic hydrogen adjacent thereto for about every fifty carbon atoms. A more limited class of such polymers are hydrocarbon in structure to avoid possible adverse effects of polar or other substituents.

It may be noted that the light adsorptions in the present process are often several orders of magnitude higher than those utilized in some other photoimaging processes, e.g., say 1 to $10 \times 10^6$ ergs/cm$^2$ compared to 10 to 100 ergs/cm$^2$ for some processes utilizing a photopolymerization reaction. This is a considerable extent a reflection of the fact that the present procedure is not a chain propagation reaction, while photopolymerization processes generally are.

The invention will be more fully understood by reference to the following examples. These examples, however, are given for the purpose of illustration only and are not to be construed as limiting the scope of the present invention in any way.

Photosensitive compositions suitable for coating paper and other suitable base supports are prepared to contain (A) a solvent or carrier (B) a photooxidation sensitizer and (C) a substrate which is photooxidized when the composition is exposed to light. Such compositions are illustrated in Example 1 below wherein the compositions A through T are applied to a styrene-butadiene coated paper. All parts are parts by weight unless otherwise specified.

EXAMPLE 1

Compositions A through T:

| Component | A | B | C | D |
|---|---|---|---|---|
| Chloroform | 300 | 300 | 300 | 300 |
| Di-2-ethylhexyl phthalate | 300 | 300 | 300 | 300 |
| Tetraphenylporphin | 2 | 2 | 2 | 2 |
| Tall oil Rosin (Acid No. 170-180) | 100 | — | — | — |
| Formaldehyde Modified Rosin (Acid No. 18 to 20) | — | 100 | — | — |
| Fortified Rosin Adduct (Acid No. about 200) | — | — | 100 | — |
| Maleopimaric Acid | — | — | — | 100 |

| Component | E | F | G | H |
|---|---|---|---|---|
| Chloroform | 300 | 300 | 300 | 300 |
| Di-2-ethylhexyl phthalate | 300 | 300 | 300 | 300 |
| Zinc chelate of tetraphenylporphin | 2 | — | — | — |
| 2,4-Dichlorotetraphenyl-porphin | — | 2 | — | — |
| 3,4-Dichlorotetraphenyl-porphin | — | — | 2 | — |
| Rose Bengal | — | — | — | 5 |
| Gum Rosin (Acid No. 160-170) | 100 | 100 | 100 | — |
| Malcopimaric Acid | — | — | — | 50 |

| Component | I | J | K | L |
|---|---|---|---|---|
| Chloroform | 300 | 300 | 100 | 100 |
| Ditetrahydrofurfuryl phthalate | 300 | 300 | 100 | 100 |
| Chlorophyll | 3 | — | — | — |
| Eosin A | — | 5 | — | — |
| Tetraphenylporphin | — | — | 2 | 2 |
| Maleopimaric Acid | 100 | — | — | — |
| Tung Oil | — | 10 | — | — |
| Gum Rosin (Acid No. 160-170) | — | — | 100 | — |
| Pinene | — | — | — | 100 |

| Component | M | N | O | P |
|---|---|---|---|---|
| Chloroform | 15 | 1.0 | 4.4 | 40.0 |
| Ditetrahydrofurfuryl phthalate | 25 | — | 3.5 | 50.0 |
| Octadecene | — | 12 | — | 25.0 |
| Chlorinated paraffin | — | 2 | — | 25.0 |
| Undecanone | — | — | 0.1 | — |
| Tributyltin Stearate | — | — | 3.5 | — |
| Dimethylfuran | — | — | 0.1 | — |
| Tetraphenylporphin | 0.1 | — | 0.1 | 1 |
| 2,4-Dichlorotetraphenyl-porphin | 0.1 | — | — | — |
| Naphthyltetraphenyl-porphin | — | 0.3 | — | — |
| Maleopimaric Acid | 2 | — | — | 5.0 |
| Gum Rosin (Acid No. 160-170) | — | 0.5 | 0.6 | 5.0 |

| Component | Q | R | S | T |
|---|---|---|---|---|
| Chloroform | 300 | 300 | 700 | 600 |
| Di-2-ethylhexyl phthalate | 300 | 300 | 700 | 800 |
| Tetraphenylporphin | 2 | 3 | 6 | 6 |
| Chlorinated Paraffin | — | — | 200 | — |
| Maleopimaric Acid | 100 | 100 | 100 | 50 |
| Tung oil rosin | — | — | — | 150 |
| Pinene | — | — | — | 100 |

The aforedescribed compositions A through T are used on coated paperboard. Exact positives of the positive transparencies used to mask the substrate are produced when the photosensitive compositions are exposed to light through the transparencies and further developed with a kerosene solution of DuPont Brown N dye.

EXAMPLE 2

A solution containing 9 parts of ditetrahydrofurfuryl phthalate and 1 part of acetophenone is applied to a paperboard previously coated with a styrene-butadiene latex. A suitable positive transparency is placed over the coated board. The board is then exposed for a period of 15 minutes to an 85 watt ultraviolet light. The exposed board is wiped with an odorless kerosene solution containing 0.4% of DuPont Brown N dye. A clear image of the transparency is obtained on the board.

Similar results are obtained as in Example 2 when the acetophenone is replaced with benzophenone, benzoin, benzil or triphenylene.

EXAMPLE 3

A paperboard previously coated with styrene-butadiene latex is coated with Composition A of Example 1. A lantern slide transparency is placed on the coated board. A fluorescent light is used to expose the board for about 10 minutes. The image is developed with a kerosene solution of DuPont Brown N dye.

EXAMPLE 4

Example 3 is repeated with a 300 watt incandescent flood lamp being used as the light source.

EXAMPLE 5

An opaque paper sheet coated with a styrene-butadiene latex is treated with a solution having the following composition:

| | |
|---|---|
| Levopimaric-formaldehyde adduct | 100 parts |
| Chloroform | 400 parts |
| Chlorinated paraffin (Chlorowax 50) | 250 parts |
| Ditetrahydrofurfuryl phthalate | 600 parts |
| Tetraphenylporphin | 3 parts |

The resulting coated sheet is useful for accepting an image of an object to be copied such as a typewritten letter on light bond paper upon directing a 1000 watt light source at a distance of 14 inches on the paper sheet for about 30 seconds with the object interposed between the light source and the treated paper. The image is developed with a 0.4% solution of Calco Oil Violet V in dodecane.

EXAMPLE 6

Following the procedure of Example 5, similar results are obtained when levopimaric acid or dihydroabietic acid is substituted for the levopimaric acid-formaldehyde adduct.

EXAMPLE 7

The following solution is prepared.

| Composition U | |
|---|---|
| | Parts |
| Chloroform | 600 |
| Chlorinated paraffin (Chlorowax 50) | 500 |
| Ditetrahydrofurfuryl phthalate | 1200 |
| Levopimaric acid-formaldehyde adduct | 50 |
| Gum Rosin | 100 |

-continued

| Composition U | |
|---|---|
| | Parts |
| Maleopimaric Acid | 50 |

A variety of photosensitizer solutions are prepared by adding 5 parts of the sensitizers listed below to 1000 parts of solution U. Each resulting photosensitizer solution is applied to a board coated with styrene-butadiene latex. The board is then covered with a transparency and exposed to a 300 watt light at 10 inches for four minutes. A kerosene solution of DuPont Brown N dye, Calco Oil Violet, Violet BN or Nigrosin B is used to produce a photographic image on the board.

The results obtained are noted below.

| Sensitizer | Interpretation of Resulting Developed Image |
|---|---|
| Tetraphenylporphin | Good picture |
| Methoxytetraphenylporphin | Faint picture |
| Zinc tetraphenylporphin | Faint picture |
| Hydroxytetraphenylporphin | Dark background |
| Naphthyltetraphenylporphin | Good picture |
| 3,4-Dichlorotetraphenylporphin | Good background and definition |
| 2,4-Dichlorotetraphenylporphin | Good background and definition |
| Chlorophyll | Good picture - fair definition |
| Eosin Y | Faint picture |
| Eosin B | Faint picture |
| Rose Bengal | Good picture |

EXAMPLE 8

A mixture containing 3 parts of 2,4-dichlorotetraphenylporphin, 400 parts of chloroform and 1600 parts of eicosane is heated to a temperature of about 40° to 50° C and applied to a paperboard coated with a styrene-butadiene latex. An excellent image is produced when the board is covered with a transparency, exposed to a 300 watt lamp and developed with a DuPont Brown N dye solution.

EXAMPLES 9 through 13

Following the procedure of Example 8, sensitizer solutions described below are substituted for the sensitizer solution of Example 8 to obtain excellent reproduced images.

| | Example Number Parts by Weight | | | | |
|---|---|---|---|---|---|
| Component | 9 | 10 | 11 | 12 | 13 |
| 2,4-Dichlorotetraphenyl-porphin | 3 | — | 3.5 | 5 | 3.6 |
| Polyethyleneglycol (Carbowax 1000) | 1100 | 150 | — | — | — |
| Polyethylene glycol (Carbowax 4000) | 900 | 50 | — | — | — |
| Rose Bengal | — | 2 | — | — | — |
| Chlorinated polyphenyl (54% chlorine) Aroclor 5442 | — | — | 400 | — | — |
| Eicosane | — | — | 1600 | — | 1000 |
| Chlorinated polyphenyl (12% chlorine) Aroclor 1254 | — | — | — | 1400 | — |
| Paraffin Wax (m.p. 65° C) | — | — | — | 700 | — |
| Chloroform | — | — | — | — | 250 |
| Butylated hydroxy toluene | — | — | — | — | 4.6 |

EXAMPLES 14 through 20

These examples illustrate the incorporation of both the photosensitizer and oxidizable substrate in the surface coating on a cellulosic web. A standard coating is prepared as follows: 1.25 grams of tetrasodiumpolyphosphate is dissolved in 300 grams of water and added to a Waring blendor. While this mixture is being stirred, 450 grams of clay and 50 grams of titanium dioxide are added. The resulting mixture is stirred for 10 minutes. One hundred twenty nine grams of a 60/40 styrene-butadiene polymeric latex containing 48% solids and 11 grams of water are added to 200 grams of the standard coating and the mixture is stirred gently for 15 minutes. Aliquots of this coating solution are mixed with the photosensitizer solution as indicated in each example below and applied to a sulfite paperboard. The results of the evaluation of each treated board as photographic substrates after exposure through transparency for 1 to 2 minutes using a 1000 watt lamp and subsequent developing with dye are given below.

| Ex. No. | Parts of Standard Coating | Parts of Sensitizer | Sensitizer Composition | Image Results |
|---|---|---|---|---|
| 14 | 7 | 3 | 1% 2,4-dichlorotetraphenylporphin in dimethyl sulfoxide | Fair picture -yellow background |
| 15 | 7 | 1.5 | Same as Example 14 | Fair picture -yellow background |
| 16 | 8 | 2 | 2% dichlorotetraphenylporphin in chloroform | Fair picture |
| 17 | 8 | 2 | 1% 2,4-dichlorotetraphenylporphin in carbitol acetate | Good picture |
| 18 | 9 | 1 | 2% Rose Bengal in carbitol acetate | Fair picture - pink background |
| 19 | 9 | 1 | Same as Example 17 | Good picture |
| 20 | 30 | .2 | 0.5% 2,4-dichloro-tetraphenylporphin in butyl cellosolve | Fair picture |

EXAMPLE 21

The styrene-butadiene latex coating material is replaced with a natural rubber latex. The sensitizer solution of Example 8 is added to the rubber latex. The resulting solution is applied to a sulfite paperboard. The resulting surface is found to produce an image when covered with a transparency, exposed to a 1000 watt lamp for 1 to 2 minutes and developed with a suitable dye.

EXAMPLE 22

A standard paperboard is double coated by the air knife method with a styrene-butadiene latex containing a 90:10 clay/titanium dioxide pigment in a ratio of two parts of pigment to one part of styrenebutadiene copolymer. A sensitizer solution containing 83.8 mg. of tetraphenyl porphin, 6.5 g. of chlorinated polyphenyl, 13.5 g. mineral oil and 8 g. of chloroform is wiped on the coated board. A negative transparency is placed on the board and exposed to a 1000 watt lamp for about 1 minute. The board is dusted with activated carbon and the excess is brushed away. An image is produced on the board. The carbon is found to adhere to the unexposed area.

EXAMPLE 23

A standard paperboard is coated with a pigmented styrene-butadiene copolymer latex. A sensitizer solution of Example 22 is applied to the coating. The coated board is exposed to light through a photographic negative transparency. The image on the board is developed with the use of a solid dye solution of crystal violet in a petroleum wax having a melting point of 117° F.

EXAMPLE 24

A standard paperboard coated with a pigmented styrenebutadiene copolymer latex (2:1 pigment to binder) is sensitized with a solution of 320 mg of tetraphenylporphin, 50 g. of chloroform, 90 g. of a 1:1 mixture $C_{18}$ hydrocarbon and chlorinated polyphenyl. Particular areas of two sets of the above-treated boards are exposed to light. The first board is wiped with graphite. The nonexposed areas become darker than the exposed area. The resistance obtained for each area is shown below. The second board is first wiped with kerosene, followed by a kerosene solution of Calco oil red BMC and then a 2-ethylhexanol solution of Victoria Blue R. The surface is finally wiped with dry graphite. The resistance obtained for each area is shown below.

|  | Board No. 1 | Board No. 2 |
| --- | --- | --- |
| Nonexposed Area | 300,000 ohm/cm | 40,000–50,000 ohm/cm |
| Exposed Area | ∞ | ∞ |

A surface which is differentially conductive is obtained on each board.

EXAMPLE 25

A standard board coated and sensitized as in Example 24 is exposed to light through a negative. The image is first developed with a kerosene solution of Sudan Brown dye and then the surface is polished with a kerosene solution of Victoria Blue R to obtain a bronzed image.

EXAMPLE 26

A standard board coated and sensitized as in Example 24 is exposed to light with a strip of aluminum foil laid on the board. After a 5 to 10 minute exposure the coated surface is wiped with kerosene and graphite. The graphite is selectively deposited on the nonoxidized area. The board is then copper plated using 1.5 volt dry cells and a copper sulfite sulfuric acid bath. The copper is deposited on the graphited areas.

A piece of brass shim stock similarly treated as the above paper board is copper plated by the same procedure. The copper is deposited on the graphited area.

EXAMPLE 27

The sensitizer solution of Example 24 is applied to a paperboard coated with a natural rubber latex. The coated board is exposed through a transparency. The surface is then wiped with kerosene to obtain a relief image.

Similar results are obtained when Rose Bengal is substituted for the tetraphenylporphin in the sensitizer solution.

EXAMPLE 28

A sulfite bleached carton stock is coated with a 4 to 5 mil thickness of coating color containing 2 parts of pigment (90:10 claytitanium dioxide) and 1 part of vinyl acetate latex of 50–60% solids. The board is sensitized with a solution containing tung oil, tetraphenylporphin, chloroform and octadecane. After exposure through a transparency the image is developed with a 0.5% solution of DuPont Brown N dye in kerosene.

EXAMPLE 29

Similar results are obtained as in Example 28 when an ethylene/vinyl chloride latex of 50–60% solids is used in place of the vinyl acetate latex.

EXAMPLE 30

The procedure of Example 28 is repeated wherein a butyl acrylate latex containing 50–60% solids is used in place of the vinyl acetate latex. An excellent image is obtained.

EXAMPLE 31

EXAMPLE 28 is repeated using polyethylene terephthalate as the base support in place of the carton stock.

EXAMPLE 32

Following the procedure of Example 28 a polyvinyl chloride latex is substituted for the vinyl acetate latex, further demonstrating successful results with unsaturation in a component (tung oil) other than the polymer.

EXAMPLE 33

A sheet of tracing paper is coated with a styrene-butadiene latex containing finely divided polyvinyl chloride. A sensitizer solution consisting of 2 parts of tetraphenylporphin, 100 parts of maleopimaric acid, 300 parts of chloroform and 300 parts of di-2-ethylhexyl phthalate is applied to the coated surface of the paper. The treated paper is placed coated side down over a printed sheet of paper the printing of which can be seen through the coated paper. A light source of 300 watts is placed 10 inches over the coated paper and printed paper for 15 seconds to obtain a latent image of the printing on the translucent paper. The latent image is developed with a solution of 0.4% Sudan Brown dye in kerosene. A reproduction of the printing of the printed sheet is obtained on the translucent paper.

EXAMPLE 34

In this example a board is coated with the sensitizer solution of Example 33. The light from a 500 watt lamp is reflected off a black image on a white background and passed through a convex lens. The rays of the light are focused for a period of about 30 minutes on the sensitized board placed about 42 inches from the image. The resultant latent image is developed with a solution of 0.5% Brown N dye in kerosene.

EXAMPLE 35

A standard paperboard coated with a styrene-butadiene latex is treated with a sensitizer solution of Example 24, and exposed through a negative transparency. The image is developed with an octanol solution of 8-hydroxyquinoline and a ferric nitrate dissolved in water. A black positive image is obtained.

EXAMPLE 36

Following the procedure of Example 35 the developed image is further treated with a solution of potassium hydroxide in ethanol to form iron oxide on the oxidized portion of the substrate.

EXAMPLE 37

Following the procedure of Example 35 the exposed substrate is developed with a solution of silver nitrate in a mixture of ethanol, isopropanol and octanol. The treated area is then exposed to hydrogen chloride vapors and light to obtain a brown image.

EXAMPLE 38

Following the procedure of Example 35 the exposed area is developed by applying in sequence the following solutions.
1. Potassium hydroxide in ethanol and octanol,
2. Hydroquinone in octanol,
3. Silver nitrate in water and mixture of ethanol and methanol.

An image is obtained wherein the metal is selectively deposited on the oxidized areas.

EXAMPLE 39

Following the procedure of Example 35 ferric sulfate is substituted for ferric nitrate to produce a yellow positive image.

EXAMPLE 40

The procedure of Example 35 is repeated except copper sulfate is substituted for the ferric nitrate. A positive image is produced.

EXAMPLE 41

A pigmented styrene/butadiene copolymer latex coated paperboard treated with a sensitizer solution of Example 24 is covered with vinylidene copolymer film which tightly adheres to the surface in some areas and leaves wrinkles in other areas. The board assembly is exposed to light and the surface is then developed with a solution of Crystal Violet in 2-ethylhexanol. The areas under the wrinkles selectively absorb the dye. The areas to which the film tightly adheres show a lack of dye receptivity.

EXAMPLE 42

Following the procedure of Example 41, drops of water are substituted on the coating for the plastic film. After exposure to light and developing with a solution of Victoria Blue R in 2-ethylhexanol, the area under the drops of water are most discernible as light areas in a dark background. The Victoria Blue R dye solution is selectively absorbed by the oxidized areas.

EXAMPLE 43

The procedure of Example 42 is repeated, except that a solution of Sudan Brown in kerosene is used to develop the exposed surface. The areas under the drops of water appear as dark areas in a light background. The Sudan Brown dye solution is selectively absorbed by the non-oxidized areas.

From the foregoing general discussion and detailed specific examples, it will be evident that this invention provides novel photosensitizer compositions which are useful for a variety of copying, printing, decorative and manufacturing appplications. The advantage lies in the inexpensive, quick and simple procedures involved in the general application of the compositions of this invention.

The photoimaging procedure employed herein is suitable for production of continuous gradient three dimensional images. Such images can be produced by using solvents to selectively remove portions of the image with the amount removed depending upon the intensity of the light exposure on the portions. In general the solvents used herein for such purpose will be relatively poor solvents for the polymer substrate involved, as a selective removal is desired. For selective removal of non-exposed areas, solvents will be selected which are effective to soften or dissolve the non-exposed areas, but which are not sufficiently effective to remove exposed areas in which hydroperoxy groups are present. Solubility parameters present a suitable guide for choosing appropriate solvents, although there will be some variance with individual members of such classes. Such parameters $\delta$ based on cohesive energy density, are described in *Solubility Parameters* by Harry Burrell, Parts I and II, Interchemical Review, Vol. 14, No. 1, pages 3–16, and Vol. 14, No. 2, pages 31–46 (1955). As the hydroperoxy groups increase the solubility parameter, the solvent will generally be selected to have a parameter slightly less than that of the polymer employed. Thus with a diene rubber having a solubility parameter around 8.5, a suitable solvent would probably have a solubility parameter less than 8, such as methylcyclohexane with a parameter of 7.8. Many of the hydrocarbon diene polymers suitable for use herein have solubility parameters in the range of 8 to 9.5, and accordingly the developing solvents usually will have solubility parameters below 8, although higher parameters may be suitable. Depending upon the polymer, e.g., cyclohexane with a parameter of 8.2 can be used with styrene-butadiene copolymers of high styrene content. Most of the solvents suitable for use herein for removal of non-exposed areas will have solubility parameters in the range of 7 to 8 or 8.2. Poorer solvents when used sometimes require longer development times, but this may not be objectionable in some applications. Aliphatic hydrocarbons, including cycloaliphatics, provide a number of suitable solvents for use with particular polymer systems, e.g., kerosene, VM and P naphthas, methylcyclohexane, octane etc. Some aliphatic, i.e. non-benzenoid, unsaturation may be present in such solvents, but aromatic solvents generally have too high a solubility parameter for use with the preferred polymer systems herein. Solvents such as benzene, toluene, etc. will ordinarily dissolve both the exposed and non-exposed areas. Thus it is not desirable to use really good solvents for the polymer for the development purposes, but to select solvents of lower solubility parameter than the polymer, e.g. 0.2 to 0.5 or more units lower. If the starting polymer is readily soluble in toluene or benzene, as is usually the case herein, the exposed areas after imaging are still readily soluble as the imaging does not cross-link or otherwise change such polymer so as to render it insoluble in such solvents. It will be recognized that the suitability of particular development solvents will vary with such factors as the molecular weight of polymers in the film substrate, characteristics of other additives or components in the film, desired speed of development, film thickness and strength, etc. The hydroperoxy groups are strongly polar, and therefore to avoid dissolution of the exposed areas, solvents lacking strong polar groups are ordinarily employed. Hydroxy, keto, etc. groups tend to increase the solubility parameter, and are therefore not generally used unless with a high solubility parameter polymer system, or if such groups are present in such proportions in the solvent as not to unduly affect the parameter. Similarly strongly halogenated solvents tend to have higher solubility parameters, and are not ordinarily employed as development solvents herein.

For the development of images by dissolution of the exposed areas, solvents of higher solubility parameter, such as polar solvents, are employed. In broad terms, solvents will dissolve polymers if the solubility parameters match. Thus if a high solubility parameter solvent is used, it can dissolve the hydroperoxidized region having a similar solubility parameter, but has too high a parameter to dissolve the non-exposed regions of the polymer. The precise relationship between the number of hydroperoxy groups and the solubility parameter is not known, but the solvents chosen should have a solubility parameter above that of the original polymer so as not to dissolve non-exposed areas. Polar solvents, such a hydroxyl containing compounds, e.g., various alcohols, glycols, cellosolves, etc. can be used. Solvents will be selected so as to give the desired degree of solubility without unduly affecting the non-exposed area, and may at times have solubility parameters considerably above that of the original polymer substrate. It is to be recognized that the solvents herein can include mixtures of various solvents, and that descriptions herein are mainly concerned with the overall characteristics of solvents, rather than with characteristics of individual components thereof. For example, a particular naphtha may be considered as a low solubility parameter aliphatic hydrocarbon solvent even though it has some aromatics content. With some of the solvents for the hydroperoxidized areas it may be desirable to use small amounts of bases, for example, alkalies such as sodium hydroxide, or chemical reagents to aid in the dissolution.

EXAMPLE 44

A sheet of release paper was coated with a solution of polymer and sensitizer. The polymer was a styrene/butadiene copolymer with a 15% butadiene content (Pliolite S-5A brand of Goodyear Co.). The solution was obtained by dissolving 50 mg. of tetraphenyl porphin in 20 grams of chloroform, and adding thereto 100 grams of a 20% solution of the polymer dissolved in toluene. The coated sheet was exposed imagewise in the presence of air through a high contrast negative using a 1000 watt tungsten halogen lamp at 18 inches for 5 minutes. The sheet was then immersed in cyclohexane for a few minutes with gentle agitation. The exposed area had turned green under the light, and the non-exposed area was dissolved away revealing the white surface therebeneath. The contrast and detail were sharp, as in a circuit board photoresist. The procedure is suitable for use in making photoresists for use e.g. in making printed circuit boards or other applications involving etching, chemical milling, plating or other deposition of materials etc. For example, if the photoresist is formed on a copper surface, areas where the coating was removed can be etched with ferric chloride solution, removing all the copper in such areas. If desired, the remnants of the photosensitive coating can then be removed with a solvent such as toluene.

EXAMPLE 45

A coated release paper was utilized and coated with a polymer containing a sensitizer. The polymer was a styrene/butadiene copolymer having equal contents of the monomeric components (XPRDC-309, available from Polymer Corporation). The coating solution was prepared by dissolving 200 mg tetraphenylporphin in 100 grams of chloroform, and adding thereto a 100 grams of a 20% solution of the polymer in benzene. The solution was coated on the paper with a No. 8 wire wound rod, and allowed to dry. The sheet was imaged as in Example 44. The sheet was then immersed in methylcyclohexane for a short time, dissolving away the non-exposed area. A red dye (2% solution) was added to make the image formed by exposed areas stand out from the white areas where the polymer had been removed. The solubility parameter of the polymer system here was apparently lower than in Example 44 because of the higher butadiene content of the polymer.

EXAMPLE 46

The styrene/butadiene polymer solution of Example 44 was coated on a 3 mil clear sheet of cellulose acetate using a No. 30 wire wound rod. The coated sheet was exposed to a light as in Example 44 for five minutes, through a continuous tone negative picture of a woman, with the negative next to the non-coated side of the sheet. The sheet was immersed in methylcyclohexane for about 15 seconds, quickly removed and rinsed with hexane. Non-exposed areas were selectively dissolved away inversely with the intensity of light exposure to give a three dimensional continuous tone image. In some areas the polymer was completely removed, with progressively more polymer in areas with a gradient dependent on light intensity. Holding the sheet up to light made the facial features of the woman readily apparent.

EXAMPLE 47

The polymer solution of Example 45 was coated on a 7.5 mil cellulose acetate sheet, which was then exposed imagewise to a continuous tone negative as in Example 46. The sheet was then dyed with a red dye to make the latent image visible. The sheet was then immersely briefly for 10 to 15 seconds in a solution of 50 ml cyclohexane and 80 ml hexane, followed by immediate rinsing with n-hexane. The non-exposed areas were differentially dissolved away, leaving a continuous tone three dimensional image. The facial features and other details of the negative were reproduced.

EXAMPLE 48

A 20% solution of styrene/butadiene polymer (Solprene 303 brand of Phillips Petroleum Co.) composed of about equal weight quantities of its monomeric components, in cyclohexane was prepared and to 50 grams of the solution was added 20 grams of chloroform containing 20 mg. of dissolved tetraphenylporphin. A piece of release paper was coated with the solution using a No. 8 wire wound rod. After drying, the sheet was exposed imagewise through a high contrast negative as in Example 44, then immersed for 15 minutes in a solution of ethyl cellosolve containing a small amount of sodium hydroxide. The sheet was then rinsed with methanol and allowed to dry. The exposed areas were dissolved away, leaving glossy non-exposed areas. This procedure can be used to make positive prints from positive transparencies. It can suitably be employed with various other polymer systems, including those employed herein in procedures in which the non-exposed area was dissolved. Thus the present invention provides sensitized compositions which can be used for either positive or negative working systems.

EXAMPLE 49

A piece of copper was whirl coated with a solution of 20 grams of the styrene/butadiene copolymer of Example 48, 200 mg. tetraphenylporphin, 80 grams chloroform, 80 grams toluene and 940 grams xylene. It was exposed through a half-tone variable dot negative for 10 minutes with a 1000 watt lamp. The plate was immersed for 13 minutes in a solution of 90 ml. 2.5 N NaOH and 10 ml acetone. It was then washed with water, dried and immersed in 40° Baume $FeCl_3$ for 7 minutes. The plate was cleaned with chloroform, and microscopic examination showed etched cells had formed in the exposed areas. The procedure can be used for preparing photoresists for various etching, chemical milling and plating procedures, in the same manner as where the coating is removed in non-exposed areas.

EXAMPLE 50

A copper square was whirl coated with a solution of trans polyisoprene (Trans-pip brand of Polymer Corporation). The coating solution contained 50 mg. tetraphenylporphin, 20 grams chloroform, 45 grams toluene, 5 grams of the polyisoprene and 140 grams of tetrahydrofuran. The square was exposed imagewise to light through a transparency, employing a 1000 watt tungsten lamp for 1 minute. The plate was immersed in 2-ethoxyethanol for 90 seconds, and the exposed areas of the coating were removed. A repeat of the procedure, but employing 2-butoxyethanol for development similarly removed the polymer in exposed areas.

EXAMPLE 51

Photooxidizable coating compositions were prepared containing a styrene/butadiene copolymer, tetraphenylporphin sensitizer and cyclohexane solvent. The amounts of the photosensitizer in three compositions were 0.1%, 0.3% and 0.6% by weight, based on the copolymer. Boards were coated with the compositions, and portions thereof used for photoimaging in the presence of oxygen with subsequent dye development to produce good images. The procedure was repeated with other portions of the boards after fifteen days storage in the dark, with no perceptible loss in image quality. Similarly storage for an additional fourteen days did not cause loss of image quality upon repetition of the procedure with other portions of the boards.

EXAMPLE 52

A surface was coated with a composition having a styrene-butadiene copolymer, 0.1% by weight tetraphenylporphin, and 0.5% by weight $CoBr_2$. The copolymer (Kraton 101) contained about 40 parts by weight styrene to 60 parts by weight butadiene. The coating was exposed imagewise for 5 seconds, heated for 2 minutes at 110° C and then treated with dye solution. A strong image was obtained. The image was comparable to that of a control coating without the cobalt salt after exposure for 300 seconds. A similar procedure was conducted in which the cobalt was applied to the coating surface as a solution of cobalt naphthenate (in isooctanol) and wiped off, with similarly good results comparable to that of a control exposed for 300 seconds. The amplification effect can be obtained using dyes which go preferentially to the non-oxidized site, such as Sudan Brown in kerosene, or dyes which go preferentially to oxidized sites, such as Crystal Violet in 2-ethylhexanol. Cobalt compounds, e.g. cobalt salts or cobalt chelates have the facility of causing cleavage of hydroperoxy groups, and this in the present process apparently causes a free radical chain reaction with incorporation of more oxygen into the polymer, thus amplifying effects of light exposure. Heating the materials accelerates the effect of the cobalt compounds, although heating is not necessary. The use of cobalt salts will be advantageous in some applications where amplification is desired. However, the use of cobalt introduces a type of reaction providing some control problems particularly with strong exposures, so its use is not always indicated.

EXAMPLE 53

Coatings applied as 10% solutions in cyclohexane, or 1:1 mixtures of toluene and kerosene were employed for photoimaging and development with dyes. Employing a styrene/butadiene block copolymer, good quality images were obtained with very little background. Similarly good results were obtained when a polybutadiene polymer was mixed with the styrene/butadiene copolymer in the coating solution or when an ethylene/vinyl acetate polymer was mixed with the copolymer. In some procedures it was observed that use of solution rather than latex coatings aided in obtaining light backgrounds.

EXAMPLE 54

An untreated cellulosic bristol board was coated with a thin film of styrene/butadiene copolymer from a 10% solution thereof in cyclohexane. The coating was sensitized with a tetraphenylporphin solution, and then exposed imagewise to light. The image was developed with a polar dye, Basacryl Red GL, L, in a 3:1 mixture of 2-ethylhexanol and ethanol. Upon rubbing off the coating, it was seen that the dye had penetrated to the board and formed an image thereon. Similar results were obtained with films of around 2, 5 and 9 microns thickness, although the image from the 9 micron film was of only fair quality with the alloted photoimaging time. The coating and imaging procedures were repeated, but employing a 15% polymer solution, so that a slightly heavier coating, about 15 microns, was obtained with No. 40 wire wound rod previously used to obtain the approximately 9 micron coating. The dye had not penetrated through this heavier coating with a 5 minute exposure time. Similar results to the above were obtained when the coating was on a sub-surface which had previously been coated with a pigmented styrene/butadiene latex (Gardner board), or with ethylene/vinyl chloride latex. Thus it is demonstrated that films or coatings can be made differentially permeable to fluids by differential light exposure, and fluids can be passed through a film or coating in imagewise fashion, for dying, deposition or other purposes on a substrate beneath the film. The exposure time or other imaging variables can be adjusted in conjunction with the coating thickness to obtain the desired degree of photooxidation penetrating to the opposite coating surface to define the image and to permit selective passage of fluids through the coating in imagewise manner. In general, fluid permeability can be used herein in the manner taught herein with respect to dye development, those carriers and dyes suitable for development being suitable for selective passage through the photoimaged film. However some dyes can be selectively passed through the film in a suitable carrier to form an image on a support surface, even though the areas of the film itself do not absorb the dye. For example polar and similar fluids, such as alcohols, can be caused to selectively penetrate the photooxidized areas of a film. Similarly, non-polar and similar type fluids can be utilized to penetrate the areas which have not been photooxidized. The solubility parameters as discussed herein can be used as a general guide, with fluids which are capable of dissolving areas being suitable for passage therethrough. Complete disintegration of the film can be avoided by using only moderate amounts of solvent at a time to achieve penetration and by avoiding mechanical stress, for example by just wiping a small amount of solvent and dye on the film. Moreover, complete solubility of the polymer is not required, but generally only that the polymer in the desired areas sufficiently absorb or be swelled by the fluid to permit penetration therethrough, so the solvents for this purpose may at times be poorer solvents than would be used for development of an image by selective removal of coating areas. The fluids will be selected to give the desired permeability through selected areas in a desired time while not passing through other areas in such time. The differentiation above was sharp enough that the penetration time was not significant, ie.e., there was prompt penetration in photooxidized areas and none in other areas. Time will be a useful control in less selective systems.

In carrying out the present invention there are advantages in utilizing polymer systems which give uniform homogeneous coatings. In particular, solution coatings systems give homogeneous coatings, whereas emulsion or other dispersion systems give coatings in which the coating film is composed of fairly large paticles, possibly formed by agglomeration together of polymer molecules. While emulsion coatings can be usefully employed, the solution coatings are definitely preferred. Also it is advantageous to have the photosensitizer well-dispersed in the polymer coating, at least on a horizontal basis to the depth in the film to which photoimaging is desired. This can advantageously be accomplished by incorporating the sensitizer in a good solvent therefor, e.g., chloroform or other solvents for tetraphenylporphin, which is compatible with the solvents used for applying the polymer coating.

While this invention has been described with respect to certain embodiments it is not so limited and it is to be understood that variations and modifications thereof may be made which are obvious to those skilled in the art without departing from the spirit or scope of this invention.

What is claimed is:

1. A multi-color image laminate comprising a substrate having a coating of appreciable thickness of a polymer having carbon-to-carbon double bond unsaturation, said polymer containing some portions which have been hydroperoxidized by imagewise exposure to light in the presence of oxygen, and other portions that have not been subjected to said exposure, wherein either the exposed or non-exposed portions contain coloring materials at different levels of the laminate to present a multi-color image to the viewer.

* * * * *